(12) United States Patent
Hunter et al.

(10) Patent No.: US 8,247,685 B2
(45) Date of Patent: Aug. 21, 2012

(54) SOLAR ENERGY HARVESTING APPARATUS

(75) Inventors: John W. Hunter, Escondido, CA (US);
Philip Sluder, El Cajon, CA (US)

(73) Assignee: The Boeing Company, Chicago, IL (US)

( * ) Notice: Subject to any disclaimer, the term of this patent is extended or adjusted under 35 U.S.C. 154(b) by 1051 days.

(21) Appl. No.: 11/644,674

(22) Filed: Dec. 22, 2006

(65) Prior Publication Data
US 2007/0227573 A1    Oct. 4, 2007

Related U.S. Application Data

(60) Provisional application No. 60/788,940, filed on Apr. 3, 2006.

(51) Int. Cl.
*H01L 31/00* (2006.01)
*H01L 31/042* (2006.01)

(52) U.S. Cl. ....................... 136/259; 136/246

(58) Field of Classification Search ............... 136/246, 136/259, 243
See application file for complete search history.

(56) References Cited

U.S. PATENT DOCUMENTS

| | | | | | |
|---|---|---|---|---|---|
| 4,045,246 | A | * | 8/1977 | Mlavsky et al. | 136/246 |
| 4,098,264 | A | * | 7/1978 | Brokaw | 126/578 |
| 4,131,485 | A | * | 12/1978 | Meinel et al. | 136/259 |
| 4,301,321 | A | * | 11/1981 | Bartels | 136/246 |
| 4,429,178 | A | * | 1/1984 | Prideaux et al. | 136/246 |
| 4,433,674 | A | * | 2/1984 | Gilleland | 126/659 |
| 5,076,857 | A | * | 12/1991 | Nowlan | 136/256 |

* cited by examiner

*Primary Examiner* — Basia Ridley
*Assistant Examiner* — Tamir Ayad
(74) *Attorney, Agent, or Firm* — Parsons Behle & Latimer

(57) ABSTRACT

A solar energy harvesting apparatus is disclosed. An illustrative embodiment of the apparatus includes a generally elongated, rectangular body having a bottom portion and sidewalls extending from the bottom portion; at least one trough provided in the bottom portion and having a trough base and trough peaks; at least one mirror strip provided along at least one peak of the at least one trough; and a linear solar cell provided along the trough base of the at least one trough.

19 Claims, 4 Drawing Sheets

SOLAR ENERGY HARVESTING APPARATUS

CROSS-REFERENCE TO RELATED APPLICATIONS

This application claims the benefit of provisional application No. 60/788,940, filed Apr. 3, 2006 and entitled "Enclosed Multi-Trough Concentrating Photo-Voltaic (EMTCPV)".

FIELD

The present invention relates to solar energy harvesting apparatuses. More particularly, the present invention relates to a solar energy harvesting apparatus which is compact and has a low profile for minimal wind loading.

BACKGROUND

Solar energy harvesting apparatuses are used in various applications to capture solar energy and convert the solar energy into electrical energy which is stored or utilized. A typical conventional solar energy harvesting apparatus includes a flat, typically rectangular solar panel on which is provided multiple solar tiles or cells. One of the drawbacks of conventional solar energy harvesting apparatuses is that the apparatuses are characterized by a high surface area, thus generating large wind loads in outdoor applications. This limits the potential applications in which the apparatuses can be used.

SUMMARY

A solar energy harvesting apparatus is disclosed. An illustrative embodiment of the apparatus includes a generally elongated, rectangular body having a bottom portion and sidewalls extending from the bottom portion; at least one trough provided in the bottom portion and having a trough base and trough peaks; at least one mirror strip provided along at least one peak of the at least one trough; and a linear solar cell provided along the trough base of the at least one trough.

BRIEF DESCRIPTION OF THE DRAWINGS

The invention will now be described, by way of example, with reference to the accompanying drawings, in which.

DETAILED DESCRIPTION

Figure 3:
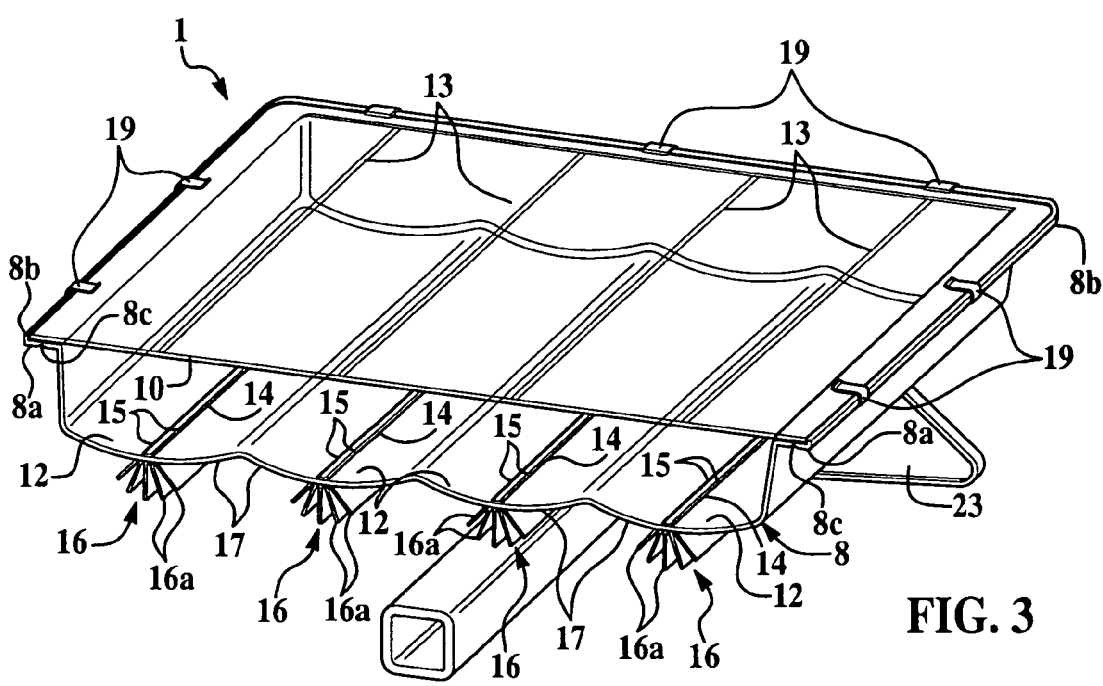
FIG. 3 is a perspective cross-sectional view of the body of the solar energy harvesting apparatus, more particularly illustrating multiple troughs provided in the body.

Referring to the drawings, an illustrative embodiment of the solar energy harvesting apparatus, hereinafter apparatus, of the invention is generally indicated by reference numeral 1. The apparatus 1 includes a generally elongated, rectangular, pan-shaped body 8. At its respective ends, the body 8 is pivotally attached to each of a pair of spaced-apart bases 23 via a trough pivot pin 24. Each of the bases 23 typically has a generally triangular shape. As shown in FIG. 3, an elongated base connector 25 connects the bases 23 to each other.

Figure 4:
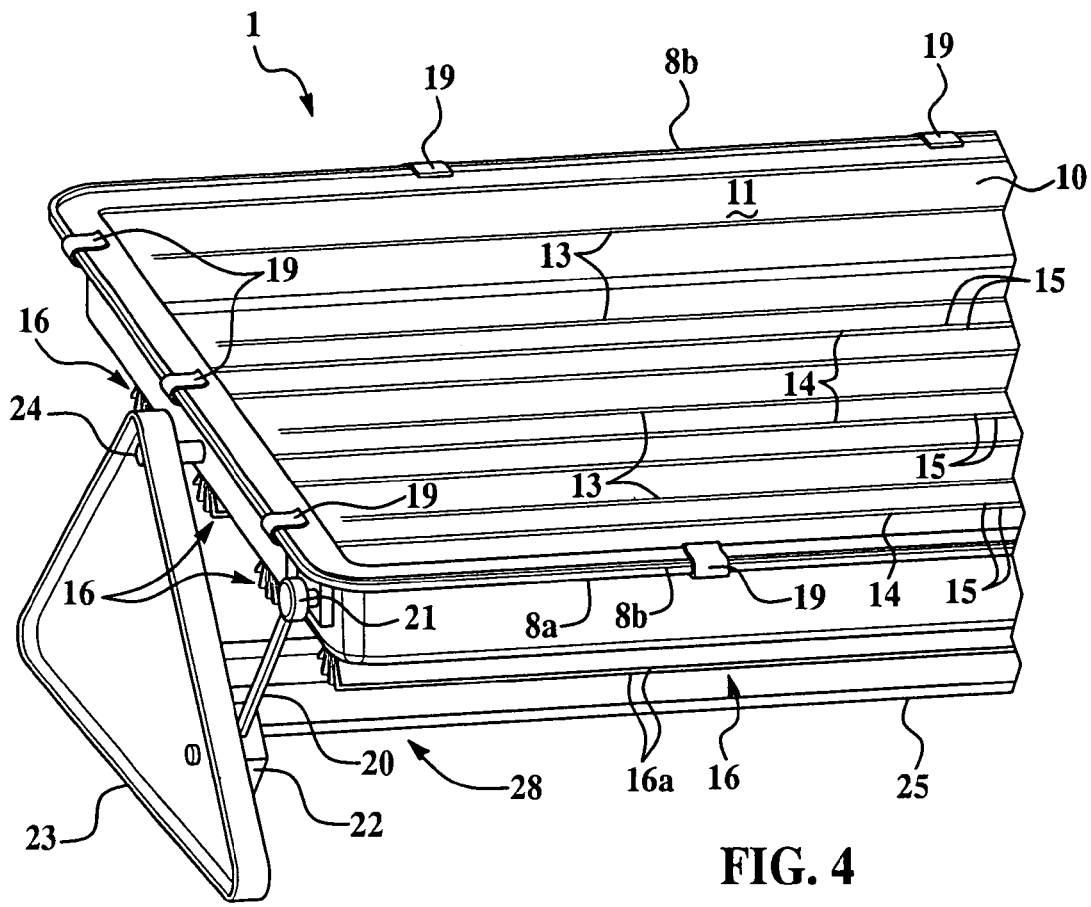
FIG. 4 is a perspective view, partially in section, of the solar energy harvesting apparatus, more particularly illustrating a trough actuator mechanism of the apparatus.

As shown in FIG. 4, a positional actuator mechanism 28 facilitates pivoting of the body 8 with respect to the bases 23. In some embodiments of the apparatus 1, the positional actuator mechanism 28 includes an elongated actuator arm 20 engages the body 8 such as through an actuator arm busing 21, for example. An actuator motor 22 is provided on a base 23 and engages the actuator arm 20 in such a manner that the actuator motor 22 reciprocates the actuator arm 20 and pivots the body 8 with respect to the bases 23 at the respective trough pivot pins 24.

Figure 2:
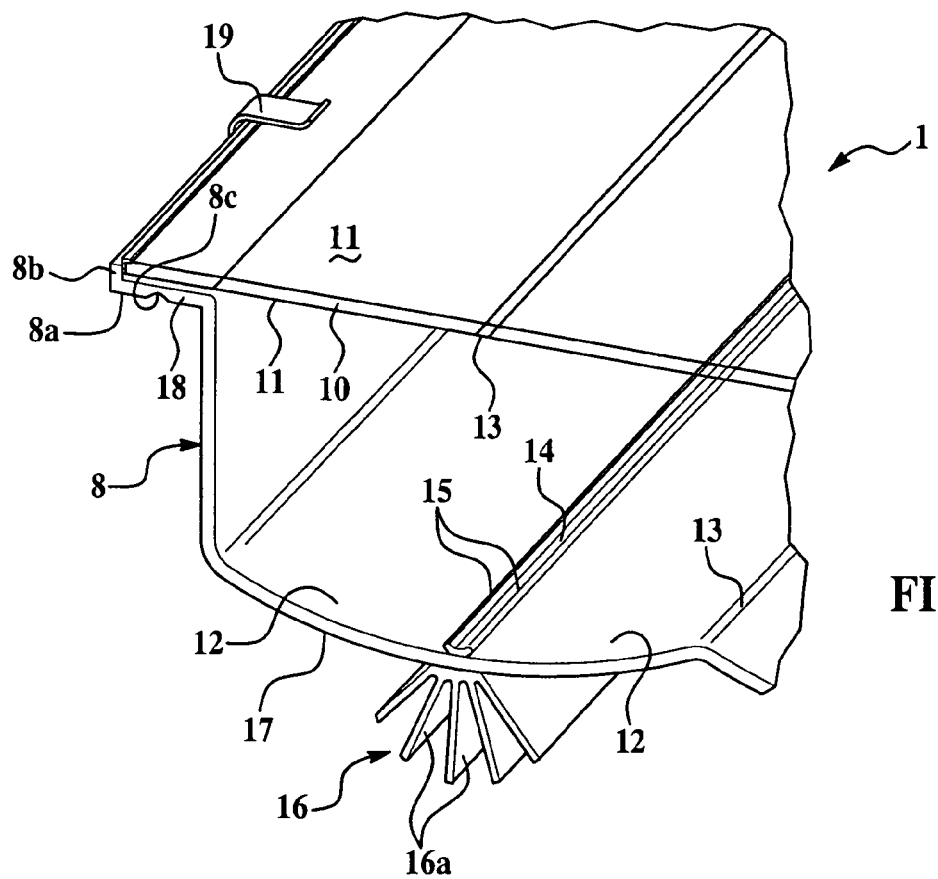
FIG. 2 is an enlarged sectional view of an illustrative embodiment of the solar energy harvesting apparatus, more particularly illustrating a trough shaped in an elongated body of the apparatus.

As illustrated in FIG. 3, at least one structural/optical trough 17 is shaped in a bottom portion of the body 8. In some embodiments of the apparatus 1, multiple adjacent structural/optical troughs 17 are shaped in the bottom portion of the body 8. As shown in FIGS. 2 and 3, each trough 17 has a primary mirrored surface 12. An elongated mirror strip 13 extends along the trough peaks of each trough 17. A linear solar cell 14 extends along a trough base of each trough 17, throughout substantially the entire length of the body 8 and in generally parallel relationship with respect to each other and with respect to each mirror strip 13. A pair of secondary spillage optics 15, each of which has a mirrored surface, extends along and adjacent to respective edges of each linear solar cell 14.

A heat sink 16 is provided along each trough 17, on the exterior surface of the body 8. In some embodiments, each heat sink 16 includes multiple cooling fins 16a which extend from the body 8 and are disposed at an acute angle with respect to each other. However, it will be recognized and understood that alternative designs for each heat sink 16 may be used instead.

A cover plate support 8a extends outwardly from the sidewalls of the body 8. A lip 8b typically extends from the cover plate support 8a. A clamp notch 8c may be provided in the lower surface of the cover plate support 8a for purposes which will be hereinafter described.

A generally transparent cover plate 10, which may be glass, is provided on the body 8. The cover plate 10 rests on the cover plate supports 8a of the body 8. An anti-reflective coating 11 is typically provided on one or both surfaces of the cover plate 10. As illustrated in FIG. 2, a resilient seal 18, such as rubber or plastic, may be interposed between the cover plate 10 and the cover plate supports 8a. Multiple clamps 19 may be provided around the perimeter of the body 8 to secure the cover plate 10 on the cover plate supports 8a. Each clamp 19 may snap into a clamp notch 8c provided in the lower surface of the cover plate supports 8a.

Figure 5:
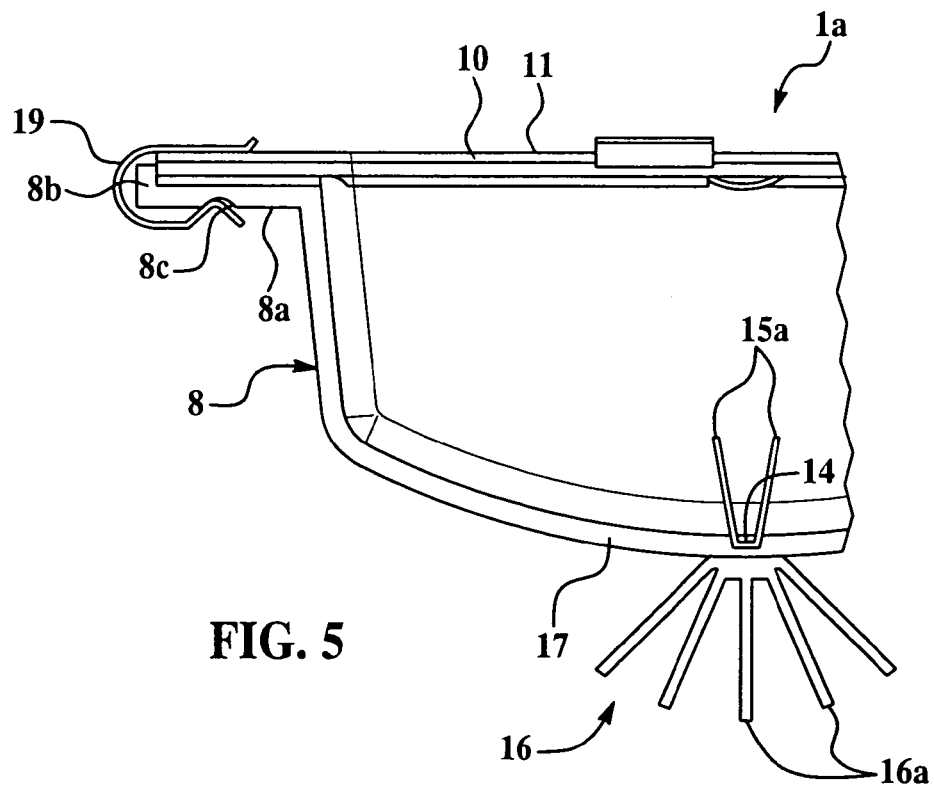
FIG. 5 is a cross-sectional view of an alternative embodiment of the solar energy harvesting apparatus.
Figure 6:
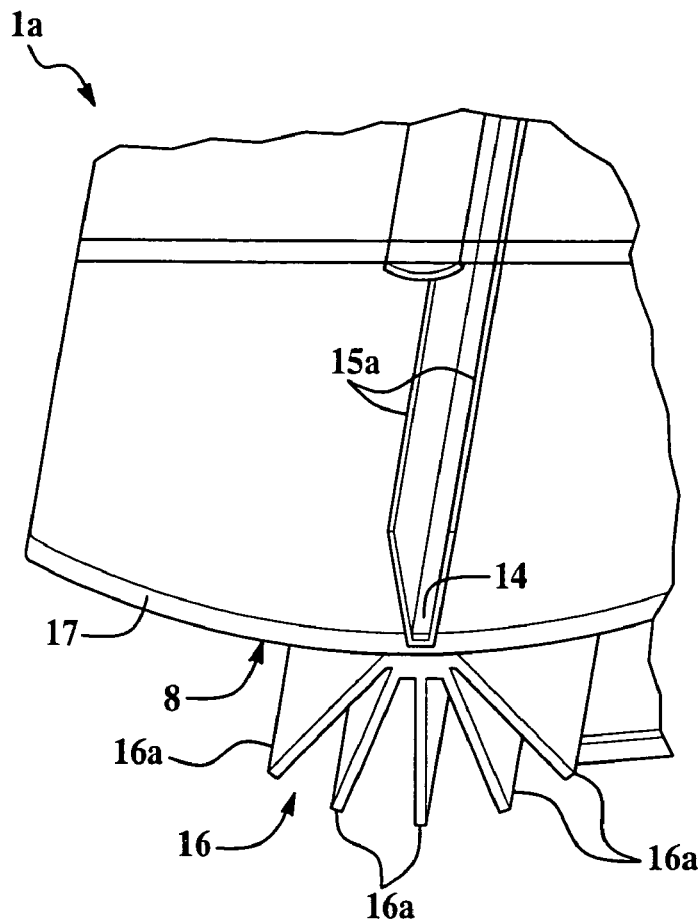
FIG. 6 is an enlarged sectional view of a linear solar cell and secondary spillage optic elements of the solar energy harvesting apparatus illustrated in FIG. 5.
Figure 7:
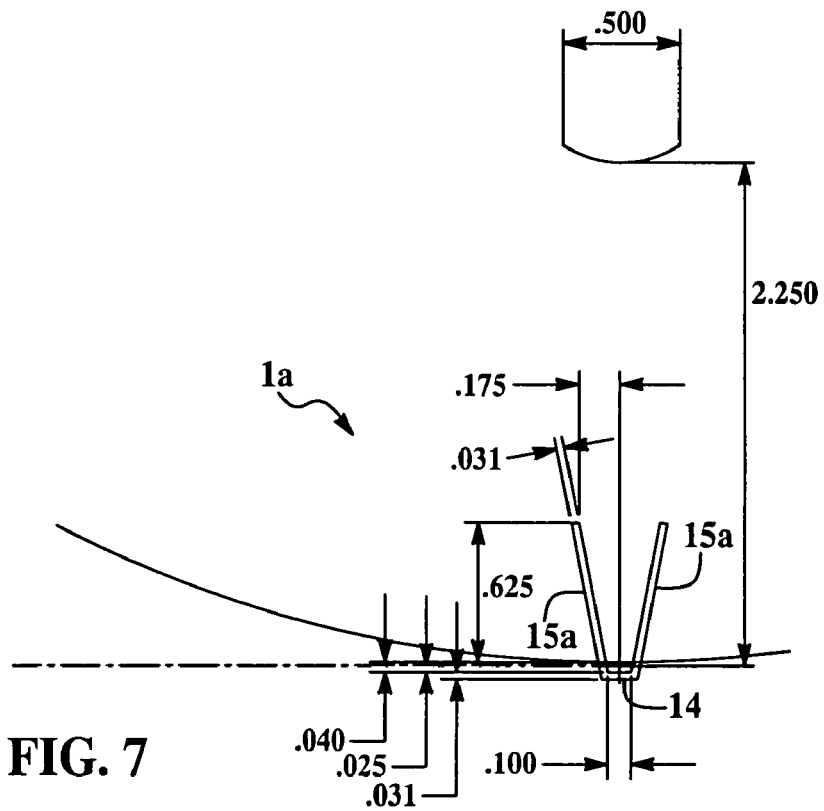
FIG. 7 is an end view of the linear solar cell and secondary spillage optic elements of the solar energy harvesting apparatus illustrated in FIGS. 5 and 6, more particularly illustrating exemplary dimensions of the elements.

Referring next to FIGS. 5-7, in an alternative embodiment of the apparatus 1a, the secondary spillage optics 15a are elongated and extend in diverging relationship away from each other on respective sides of each linear solar cell 14. Typical dimensions for each linear solar cell 14 and secondary spillage optic 15a are shown in FIG. 7.

Figure 1:
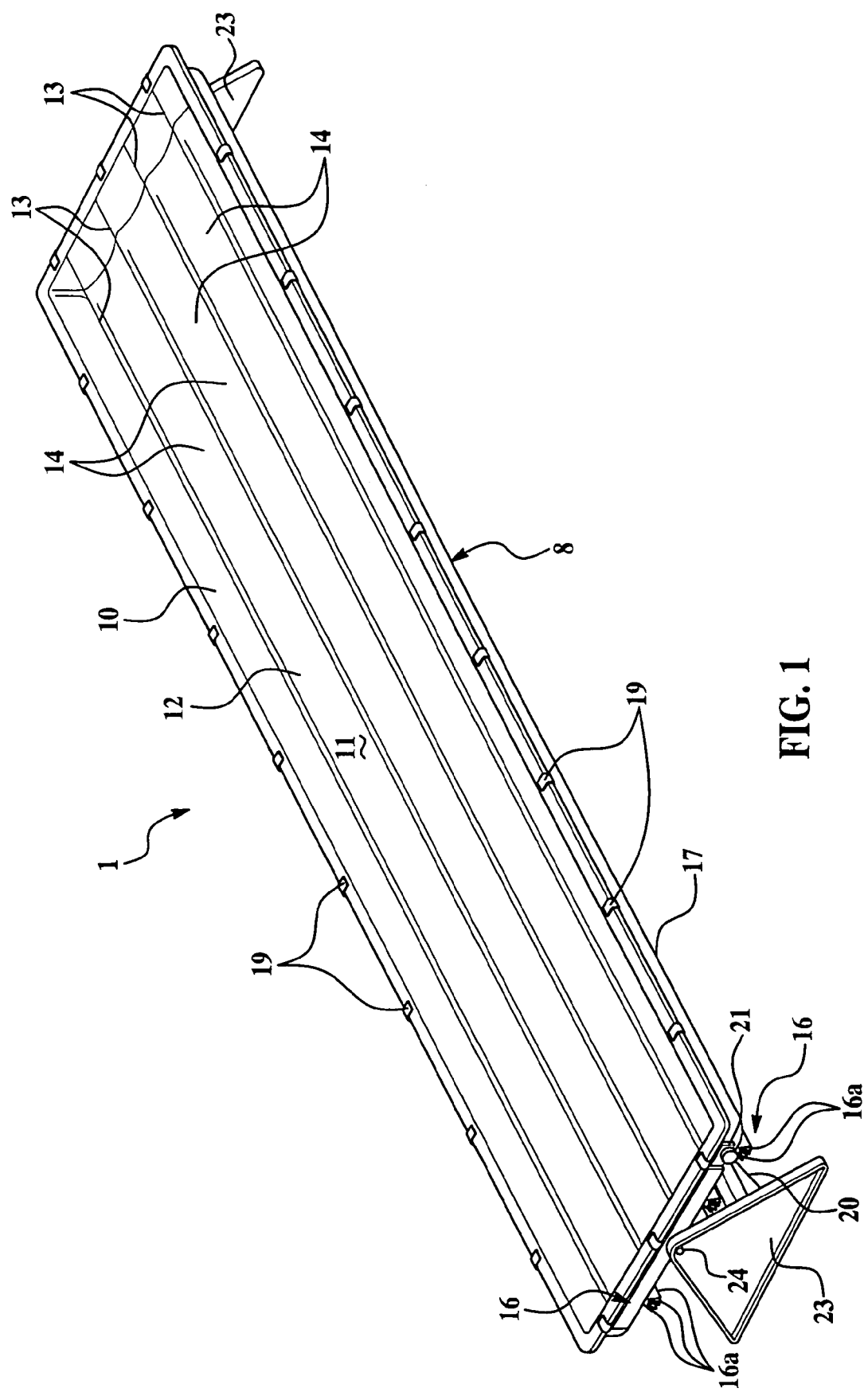
FIG. 1 is a perspective view of an illustrative embodiment of the solar energy harvesting apparatus.

FIG. 1 shows a perspective view of the apparatus 1 in use. Normally, the orientation of the apparatus 1 is based on the expected wind loads and latitude of the apparatus 1 from the equator. Typically in an area of significant winds, the apparatus 1 should be oriented lengthwise in the direction of the winds to minimize wind loads. Any number of apparatuses 1 may be used, ranging from usage of a single apparatus 1 of less than 1 kW of electrical power to one or multiple apparatuses 1 generating multiple megawatts of electrical power. Site preparation prior to installation of the apparatus 1 may involve installation of footings (not shown) having typically concrete pylons into soil (not shown) or a simple supporting frame (not shown) for the apparatus 1 if the apparatus 1 is to be deployed on a rooftop. The bases 23 of the apparatus 1 may be mechanically connected to the pylons or the frame with conventional fasteners (not shown) such as bolts, for example. Additional requirements may involve the use of wiring, nominal DC/AC converters and step up transformers for off-site delivery of electrical power.

An electronic controller (not shown) is typically connected to the actuator motor 22 of the positional actuator mechanism 28. The controller may include a sun sensor which facilitates tracking of the apparatus 1 with the sun throughout the day. The sun sensor may also allow the apparatus 1 to assume an orientation which is conducive to cleaning and maintenance of the apparatus 1 when needed. In the event of extremely high winds against the apparatus 1, the controller may be programmed to direct the apparatus 1 into a horizontally-stowed position. In the event of adverse weather conditions such as hail, the controller may be programmed to direct the apparatus in a down-wind direction. A single controller may be used to control a large number of apparatuses 1.

In operation, the apparatus 1 tracks the sun (by operation of the actuator motor 22) within $1/10^{th}$ of a degree. Typically, the sun's rays enter the glass cover plate 10 with minimal reflection and absorption losses. The rays are focused initially by the primary mirrored surface 12 and then again by the secondary mirror strip 13 before impinging on the linear solar cells 14. Any optical misalignment is compensated by the secondary spillage optics 15. In the embodiment which is shown in FIG. 3, the apparatus 1 includes four troughs 12 typically having a total width of 20 inches and a length of 100 inches (1.29 m$^2$). Typical values are:

Initial Solar Fluence at 850 Watts/m$^2$ (Concentrators don't accept photons scattered by the atmosphere)
Cover plate 10 transmission=99% when clean
Primary mirror 12 reflectance=95%
Secondary mirror 13 reflectance=95%
Silicon solar cell efficiency 14=25%
DC/AC conversion efficiency=85%
Power=850 Watts/m$^2$ (1.29 m$^2$) (99%) (95%) (95%) (25%) (85%)=208 Watts (AC) Placement of the apparatus 1 for a typical year at a location such as Phoenix, Ariz. will yield more than 2000 hours of full sun equivalent. Therefore, the apparatus 1 produces:
Energy/year=0.208 kilowatts*2000 hours=416 kWh Maintenance on the apparatus 1 can be performed at regular intervals. The three areas of interest are:
1. Maintaining a clean glass cover plate 10;
2. Preventive maintenance on the positional actuator mechanism 28; and
3. Inspection of the seal 18.

Site selection will play a significant role in minimizing the glass cover plate 10 cleaning requirements. For example, a location which is relatively free from dust storms is preferred. Periodic cleaning is facilitated by the linear configuration of the apparatus 1, allowing drive-by spraying with water and mechanical brushing or wiping if required. The positional actuator mechanism 28 should be lubricated and inspected as often as needed. Due to the vital nature of the seal 18, it may be visually inspected through the glass cover plate 10.

One advantage of the apparatus 1 is that the typically multi-trough geometry of the body 8 allows for near continuous production of the components of the apparatus 1. For example, the linear solar cell 14 is more easily processed than an equivalent number of conventional square solar cells. Likewise, due to its high length-to-width ratio, the body 8 is readily fabricated in a single step from deep-drawn formed steel, or alternatively, rolled or extruded metal. In comparison, a stamped series of conventional square solar cells has approximately L/W (Length over Width which in the case shown equals 100"/20" or five) times as many parts/mechanical operations as a single body 8 of the apparatus 1. This simple analysis holds for the single glass cover plate 10, the body 8, the linear solar cell 14, the secondary spillage optic 15 and the heat sink 16.

Another advantage of the apparatus 1 is the moderate concentration (C<220) requires air cooling rather than liquid cooling. The 1-d focusing and resultant linear solar cells 14 present more surface-to-volume than does a 2-d focusing concentrator or solar cell. This allows for use of a conventional finned heat sink and only modest temperature rise.

Another advantage of the apparatus 1 is that the multiple troughs 17 (FIG. 3) enable a reduction of the height of the body 8 by a factor which is equal to the number of internal troughs 17. Therefore, N=four internal troughs 17 which facilitate a reduction in the height of each trough 17 by a factor of four. Any wind impinging on the presented side of the body 8 will impact 1/N times the area that would be presented by a single equivalent trough. In addition, the low height-to-width ratio of the body 8 renders the shape of the body 8 more aerodynamic, and hence, imparts a lower drag coefficient to the apparatus 1. In the case of a purely horizontal wind, wind loading can be expressed as:

$$F\text{drag}=Rho*C\text{drag}*V^2/2*\text{Area} \qquad 1.$$

$$F\text{lift}=Rho*C\text{lift}*V^2/2*\text{Area} \qquad 2.$$

The drag force drops by a factor of at least 1/N due to the reduced area of the body 8.

It will be appreciated by those skilled in the art that the orientation of the apparatus 1 can be selected to minimize expected wind loads against the body 8. Advantageously, the choice of orientation facilitates selection of a layout direction that minimizes wind loads. For example, if the wind is predominately East-West and West-East, then the apparatus 1 can be oriented lengthwise along the East-West axis to minimize the presented area. Various orientations of the apparatus 1 do not affect solar output significantly. By comparison, heliostats which utilize 2-d focusing and tracking are strictly vulnerable to wind direction. The apparatus 1 is much less massive, resulting in minimized wind loads.

One advantage of the apparatus 1 is that the cover plate 10 dramatically reduces the drag coefficient. A drag force reduction of approximately 20% or more due to the cover plate 10 is anticipated.

One advantage of using a glass cover plate 10 is its high modulus (Y>7 million psi). This gives the entire apparatus 1 optimum stiffness in the focusing direction. The high cross stiffness reduces the amplitude of both static load deformations as well as aerodynamically-driven loads.

One advantage of the apparatus 1 is that the cover plate 10 can have an antireflective coating 11 such as magnesium fluoride, for example. With the antireflective coating 11 on both surfaces of the cover plate 10, less than 1% reflectance loss can be expected. Without the antireflective coating 11, reflectance losses of about 8% result due to the index of refraction difference between air and glass.

The cover plate 10 is typically hydrophilic. This is advantageous due to reduced requirement for cleaning as well as ease of cleaning. Typical hydrophilic coatings are extremely thin (sub micron) layers of $TiO_2$ and $SiO_2$.

The cover plate 10 protects the focusing optics and linear solar cells 14. This is advantageous since dirt, moisture, salt and hail are anathema to mirrors and solar cells. In areas with salt air, corrosion is a significant problem and it is advisable to enclose electronics and delicate optics. For example, salt air corrosion was extremely problematic for the Euclides Concentrating Photovoltaic Project in the Canary Islands. Thickness of the cover plate 10 can vary depending on structural requirements, but nominally ⅛" thick low iron glass is preferred for the cover plate 10 due to its adequate hail resistance and optimum transmissivity.

Multiple troughs 17 in the body 8 reduce the structural weight of the apparatus 1. In the apparatus 1 illustrated in FIG. 3, four internal troughs 17 facilitate reduction in the height of the sidewalls of the body 8 by a factor of four. This reduces the weight and area of the sidewalls.

Another advantage of the apparatus 1 is that the bottom of the body 8 supplies structural rigidity in the axial/long direction while simultaneously serving as a mirror. The glass cover plate 10 imparts stiffness in the cross/wide direction while the body 8 and heat sinks 16 supply complementary stiffness in the axial/long direction. The heat sinks 16 may be extruded as part of the body 8. The mirror/structure or optical/mechanical duality reduces part count and weight.

Another advantage of the apparatus 1 is that the primary mirrored surface 12, secondary mirror strip 13 and secondary spillage optic 15 surfaces may be comprised of silver or aluminum, vacuum deposited on the trough bottom 17 and glass cover plate 10. These first surface optics promise to be more efficient and have less optical aberration than second surface mirrors. A first surface optic is allowed since the volume is hermetically sealed from the environment during operation.

The linear 1-d Cassegrain optics of the linear solar cells 14 are compact and error-tolerant. Another advantage is the Cassegrain optics allow for a more compact system since the sun's rays are reflected twice in one focal length before impinging on the linear solar cell 14. The linear nature of the optics allows relaxation of optical requirements in the longitudinal direction of the body 8. The optical requirements in the focusing dimension will be less tolerant since errors there may result in lost photons. The apparatus 1 has the same compactness as a conventional 2-d focusing Cassegrain optic, yet is approximately twice as tolerant of surface errors due to its 1-d focusing. In addition, photons have close to normal impingement on the linear solar cell 14 in the non-focusing dimension. This helps in terms of sunlight absorption and uniformity of intensity on the linear solar cell 14. 2-d focusing systems often require a homogenizer to render the intensity more uniform. The apparatus 1 does not require a homogenizer. Any aberrations due to the 1-d focusing can be minimized with the secondary mirror strip 13 and the secondary spillage optic 15.

Installation, operation and maintenance of the apparatus 1 are less expensive than for heliostats. Another advantage of the apparaturs 1 is that its linear configuration, as well as its modest height above ground level, lends the apparatus 1 to easy maintenance and construction in the field. As an example, it is well known in the agricultural community that planting, maintaining and harvesting trees requires significant manual labor. Hence, tree crops tend to be expensive. On the other hand, row crops like wheat, corn and alfalfa are amenable to mechanized planting, maintenance and harvesting. The difference in the cost of row crops versus tree crops can be more than a factor of 10 on a per pound basis. By analogy, tree crops are similar to heliostats while row crops are similar to the apparatus 1. The linear configuration of the apparatus 1 reduces the installation, operation and maintenance costs of the apparatus 1.

The apparatus 1 includes optical and mechanical structures as well as the sunlight conversion element. Starting with the glass cover plate 10, FIG. 2 shows that the glass cover plate 10 is designed to:

Provide a barrier to wind, moisture, corrosives like salt, hail and dirt

Allow sunlight through with a minimum of reflectance and absorption this is performed with an anti-reflection (AR) 11 coating and the use of clear iron free or "Water White" glass Reduce wind drag by streamlining the EMTCPV Provide structural stiffness due to its high modulus thus allowing good optical alignment particularly in the focusing dimension Allows easy washing through the use of a hard, hydrophilic 11 surface and being located slightly above flush with the container body Be easily removed by pulling off the stainless steel edge clamps 19

Allow mounting of the secondary mirror 13 using an appropriate adhesive

The flexible seals 18 are designed to hermetically seal and protect the first surface optics 12, 13, 15 and the solar cells in the interior from the elements. The stainless steel edge clamps 19 serve to attach the glass cover plate to the top of the EMTCPV. The flexible nature of the clips insures against creep in the event the trough body is made of plastic. The top lip on the EMTCPV is designed to accommodate the differential expansion of the different materials. Representative expansion coefficients of candidate materials are:

CE (steel)=7e-6 inches/inch/F
CE (glass)=5e-6
CE (aluminum)=12e-6
CE (PVC)=29e-6

For example, assuming a temperature swing of 50 degrees F and a length of 100 inches, the glass cover plate 10 will have a thermal expansion of 0.025". A steel trough body will have a thermal expansion of 0.035". The differential expansion is 0.035"−0.025"=0.010" which is easily accommodated by a small gap in the top lip of the EMTCPV.

The linear solar cell 14 shown in FIGS. 1-3 can be a high performance silicon concentrator cell like those made by Amonix Inc. or it can be a III-V multi-junction cell such as those made by Spectrolab, Inc. The solar cells 14 may be one or more inches long and approximately 0.05 inches wide. This corresponds to a concentration ratio of 100 since each parabolic trough 12 is five inches across. Due to its large length to width ratio the solar cell will be amenable to mass production in a continuous process. This will be easier to mass produce than the standard square solar cells. The solar cell 14 is attached with thermally and electrically conductive glue to the center of the spillage optic 15. The spillage optic 15 serves to redirect errant photons that have been misguided by anomalous primary or secondary optics or atmospheric scattering. The finned heat sinks 16 serve to dissipate the heat from the solar cells 14. They may be extruded as part of the trough or they may be attached with conductive paste and conventional screws. As a crude rule of thumb we are using heat sinks that have slightly more surface area than the aperture area of the EMTCPV. The heat sink 16 material is high conductivity aluminum.

The primary optics are the basic parabolic shapes 12 at the bottom of the EMTCPV. FIG. 3 shows we use four parabolic troughs per EMTCPV in this version. The classic parabola with focal length F is defined by:

$$Y = X^2/(4F) \qquad 1.$$

One can show that the maximum theoretical concentration due to 1-d focusing is:

$$C_{max} = 1/\sin(Thetasun) = 220 \qquad 2.$$

Where Thetasun is the sun half angle of about 0.26 degrees. In practice we expect concentration values between 30 and 220. Note that the secondary mirror 13 in conjunction with the spillage optic 15 can play a part in obtaining the higher magnifications since one can show that a single parabolic mirror can produce a maximum concentration of half that shown in equation 2. Our classic Cassegrain optic has a concave parabolic primary mirror 12, 17 and a convex hyperbolic secondary mirror 13. The optimization of our primary and secondary optical design for a particular concentration is straightforward to one who is skilled in the art. Optimization requires some time spent ray tracing on a computer. The secondary mirror 13 can be comprised of an extruded aluminum strip with desired convex shape and an optional silver or aluminum surface finish. It can be attached to the glass cover plate 10 with an appropriate adhesive.

The multi-trough shape 17 can be produced by conventional deep drawn formed steel methods. This is similar to the manufacture of car fenders. It is then polished to obtain an optical surface. If the trough 17 is made of aluminum it may be unnecessary to coat it with reflective material. A steel trough 17 will require a deposit of silver or aluminum 12. Typical sputtered amounts of silver are 40 to 60 milligrams per square foot of mirror.

FIG. 4 shows the mechanical sub structure includes the actuator assembly 20, 21, 22, the bases 23 and the bases connector 25. The actuator can be a stepper motor 22 rotating a captured nut on a threaded rod 20. The threads should be fine enough to restrict backlash to less than $\frac{1}{10}$th of a degree. The actuator arm bushing 21 is located near the edge of the EMTCPV in order to generate small and precise angular movement for a given actuator arm 20 motion. The bases 23 are simple triangular steel structures and the steel base connector 25 may be welded to them with the appropriate spacing. The trough/base pivot point 24 is located near the trough center of gravity to minimize power requirements during solar tracking and stowing.

It is to be understood that the typically glass cover plate 10 does not require an antireflective coating 11 or a hydrophilic coating (not shown). If these are not utilized the apparatus 1 will still work but it will not be as efficient or as easy to clean. The seals 18 can be replaced with o-ring seals with grooves in the upper lip of the body 8. The multiple edge clamps 19 can be replaced with a single framing type edge clamp (not shown) if desired. The framing type edge clamp can be mounted with screws.

The primary optics may be a spherical mirror which may be relatively easy to fabricate. The secondary mirror is then shaped appropriately to obtain the desired concentration. One can use a separate glass or plastic mirror that is installed inside the troughs. This is an alternative to using the trough body as the mirror. The secondary optic can be formed from the underside of the glass cover plate. The forming can be the result of an operation while the glass is still hot and malleable. Some final polishing may be needed prior to vapor depositing an aluminum or silver mirror first surface.

Instead of using solar cells, one can use a tubular heat exchanger to allow a heated fluid to transit the trough. Here the glass cover plate will dramatically reduce convective heat losses and reduce mirror maintenance.

Although this invention has been described with respect to certain exemplary embodiments, it is to be understood that the specific embodiments are for purposes of illustration and not limitation, as other variations will occur to those of ordinary skill in the art.

What is claimed is:

1. A solar energy harvesting apparatus, comprising:
   a generally elongated, rectangular body having an elongated bottom portion and sidewalls extending from said bottom portion;
   at least one trough having a single continuously formed parabolic mirror surface disposed in said bottom portion, said trough comprising a trough base and trough peaks positioned opposite to each other at respectively highest portions of said trough;
   a first mirror strip along and upon at least one peak of said at least one trough;
   a linear solar cell provided along said trough base of said at least one trough;
   a transparent cover plate, in a single plane covering the entire apparatus, provided on said body covering said at least one trough, said transparent cover plate spaced apart from said at least one peak of said at least one trough; and,
   a second mirror strip provided upon said transparent cover plate and overlying said linear solar cell.

2. The apparatus of claim 1 further comprising at least one mirrored spillage optic provided along said linear solar cell.

3. The apparatus of claim 2 wherein said at least one mirrored spillage optic comprises a pair of mirrored spillage optics provided on respective sides of said linear solar cell.

4. The apparatus of claim 1 wherein said cover plate comprises glass.

5. The apparatus of claim 1 further comprising cover plate supports extending from said sidewalls of said body and wherein said cover plate is carried by said cover plate supports.

6. The apparatus of claim 5 further comprising a plurality of clamps detachably securing said cover plate on said cover plate supports.

7. The apparatus of claim 1 further comprising at least one heat sink provided on said bottom portion of said trough.

8. A solar energy harvesting apparatus, comprising:
   a pair of spaced-apart bases;
   a generally elongated, rectangular body pivotally carried by said pair of spaced-apart bases and having an elongated bottom portion and sidewalls extending from said bottom portion;
   at least one trough comprising a first mirror surface provided in said bottom portion, said bottom portion comprising a trough base, said trough comprising trough peaks, said trough peaks comprising respectively highest portions of said trough adjacent either side of said bottom portion;
   at least one first mirror strip comprising a second mirror surface provided along and upon at least one peak of said at least one trough;
   a linear solar cell provided along said trough base of said at least one trough;
   a transparent cover plate, in a single plane covering the entire apparatus, provided on said body covering said at least one trough, said transparent cover plate spaced apart from said at least one peak of said at least one trough;

at least one second mirror strip provided upon said transparent cover plate and overlying said linear solar cell; and a positional actuator mechanism engaging said body.

9. The apparatus of claim 8 wherein said positional actuator mechanism comprises an actuator arm engaging said body and an actuator motor carried by one of said pair of spaced-apart bases and engaging said actuator arm, said actuator motor adapted to reciprocate said actuator arm and pivot said body on said pair of spaced-apart bases.

10. The apparatus of claim 8 wherein each of said pair of spaced-apart bases has a generally triangular shape.

11. The apparatus of claim 8 wherein said first mirror surface comprises a primary mirrored surface provided on said bottom portion of said body.

12. The apparatus of claim 11 wherein said at least one mirror strip provided on said transparent cover plate comprises a secondary mirror.

13. The apparatus of claim 12 further comprising at least one secondary spillage optic provided on said bottom portion of said body along said linear solar cell.

14. The apparatus of claim 13 wherein said at least one secondary spillage optic comprises a pair of secondary spillage optics provided along respective sides of said linear solar cell.

15. The apparatus of claim 8 further comprising at least one anti-reflective coating provided on said cover plate.

16. A solar energy harvesting apparatus, comprising:
a pair of spaced-apart bases;
a generally elongated, rectangular body pivotally carried by said pair of spaced-apart bases and having an elongated bottom portion and sidewalls extending from said bottom portion;
a plurality of adjacent troughs provided in said bottom portion and each having a trough base and trough peaks, said trough peaks comprising respectively highest portions of said trough adjacent either side of said bottom portion;
a primary mirrored surface provided on said bottom portion of said body;
a plurality of first mirror strips adjacent to said primary mirrored surface provided along and upon said trough peaks, respectively, of said plurality of troughs;
a plurality of linear solar cells, one of said plurality of linear solar cells provided along each said trough base of said plurality of troughs, respectively;
a pair of mirrored secondary spillage optics provided on said bottom portion of said body on respective sides of each one of said plurality of linear solar cells;
a transparent glass cover plate, in a single plane covering the entire apparatus, provided on said body, said transparent cover plate spaced apart from said trough peaks;
at least one anti-reflective coating provided on said cover plate;
a plurality of second mirror strips comprising secondary mirrors provided upon said transparent glass cover plate, each of said mirror strips overlying each one of said plurality of linear solar cells; and
a positional actuator mechanism having an actuator motor carried by one of said pair of spaced-apart bases and an actuator arm engaged by said actuator motor for reciprocation by said actuator motor and engaging said body.

17. The apparatus of claim 16 further comprising cover plate supports extending from said sidewalls of said body and wherein said cover plate is carried by said cover plate supports and further comprising a plurality of clamps detachably securing said cover plate on said cover plate supports.

18. The apparatus of claim 16 further comprising a plurality of heat sinks each having a plurality of elongated cooling fins provided on said bottom portion of said trough.

19. The apparatus of claim 16 wherein said pair of mirrored secondary spillage optics extends in generally divergent relationship from each other.

* * * * *